(12) United States Patent
Lambert et al.

(10) Patent No.: US 7,595,607 B2
(45) Date of Patent: Sep. 29, 2009

(54) BATTERY CHARGING SYSTEM AND METHODS

(75) Inventors: Joe Lambert, Raonoke, VA (US); Brian N. Meyer, Salem, VA (US); John S. Harrison, Roanoke, VA (US); Sherrill Thomas, Chatham, VA (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 11/312,867

(22) Filed: Dec. 20, 2005

(65) Prior Publication Data

US 2007/0139016 A1 Jun. 21, 2007

(51) Int. Cl.
*H02J 7/00* (2006.01)

(52) U.S. Cl. .............. 320/106; 320/107; 320/109

(58) Field of Classification Search .......... 320/107, 320/139, 155, 157, 162, 106, 108
See application file for complete search history.

(56) References Cited

U.S. PATENT DOCUMENTS

| 4,443,752 | A | 4/1984 | Newman |
| 4,829,223 | A | 5/1989 | Broberg et al. |
| 5,650,712 | A * | 7/1997 | Kawai et al. ............... 324/427 |
| 5,659,240 | A | 8/1997 | King |
| 5,949,220 | A * | 9/1999 | Ide et al. .................... 320/165 |
| 6,025,706 | A | 2/2000 | Takimoto et al. |
| 6,114,833 | A | 9/2000 | Langston et al. |
| 6,218,812 | B1 | 4/2001 | Hanson |
| 6,534,950 | B2 | 3/2003 | LeBoe |
| 6,795,913 | B1 * | 9/2004 | Ricordel ...................... 713/2 |
| 6,861,823 | B2 | 3/2005 | Bucur |
| 6,917,180 | B2 | 7/2005 | Harrison et al. |
| 6,963,186 | B2 | 11/2005 | Hobbs |
| 2001/0048226 | A1 | 12/2001 | Nada |
| 2003/0015358 | A1 * | 1/2003 | Abe et al. ................. 180/65.3 |
| 2004/0239288 | A1 * | 12/2004 | Harrison et al. ........... 320/104 |
| 2005/0110462 | A1 * | 5/2005 | Ullrich et al. ............. 320/128 |

* cited by examiner

*Primary Examiner*—Akm E Ullah
*Assistant Examiner*—Johali A Torres Ruiz
(74) *Attorney, Agent, or Firm*—Armstrong Teasdale LLP

(57) ABSTRACT

A method for determining whether a battery is electrically and physically connected to a battery charger includes monitoring a battery charging voltage supplied by a battery charger that has superimposed a known signal on the battery charging voltage, and determining that the battery charger is connected when the known superimposed signal is present and that the battery charger is not connected when the known superimposed signal is absent.

18 Claims, 4 Drawing Sheets

BATTERY CHARGING SYSTEM AND METHODS

BACKGROUND OF THE INVENTION

This invention relates generally to recharging of batteries and more particularly to safety systems and methods suitable for battery recharging.

Electric vehicles are becoming more commonplace. However, nowhere are they encountered more frequently than on the golf course. For example, golf carts are heavily used by many different individuals and have to be recharged often. Existing battery chargers for these vehicles do not communicate with the vehicle being charged. Therefore, it is possible for a driver to attempt to operate a charging vehicle while that vehicle is still plugged into the charger, often producing disastrous results. Although this event is most often seen on the golf course today, it is a hazard that exists with all electric vehicles capable of being charged by being plugged in to an external power source, such as a wall outlet, or by plugging into any external charger.

At least one known prior art vehicle charging system uses an additional electrical wire connected between the charger and the vehicle other than the current carrying wires to detect when the vehicle is plugged into the charger. When the vehicle is connected to the charger, a warning light or other indication is displayed on the dashboard of the vehicle and/or the vehicle is prevented from running. Although effective, the addition of this extra wire adds to cost to the charging system and requires the manufacturing of special cords and receptacles.

One aspect of battery charging that makes it difficult to determine whether a battery in a vehicle is still connected to a charger is that, when fully charged, there is no current flowing in the connection and the battery voltage is equal to the charger voltage. One might place a relay or a solid state switch in circuit, so that charging current flows from the battery charger through the relay or switch and then to the battery. When the relay is opened or the switch is made non-conductive, a voltage would still remain on the charger side of the relay or switch if the charger were still connected, but no voltage would remain if the charger were not connected. Unfortunately, charging currents for vehicles are usually quite substantial, and the relay or switch would have to be able to carry the full amount of charging current while the battery is being charged. Thus, this approach to determining whether a vehicle is connected to a charger can be expensive and unpractical.

BRIEF DESCRIPTION OF THE INVENTION

The present invention, in one aspect, therefore provides a method for determining whether a battery is electrically and physically connected to a battery charger. The method includes monitoring a battery charging voltage supplied by a battery charger that has superimposed a known signal on the battery charging voltage, and determining that the battery charger is connected when the known superimposed signal is present and that the battery charger is not connected when the known superimposed signal is absent.

In another aspect, the present invention provides a battery charger that includes a DC charging circuit configured to provide a DC charging voltage, and a signal superimposing circuit configured to superimpose a known, preselected signal on the DC charging voltage.

In yet another aspect, the present invention provides a device that includes a chargeable battery and a superimposed signal detector configured to detect a known superimposed signal on a battery charging voltage. The device is configured either to signal that a battery charger is connected to the device or to inhibit operation of at least a portion of the device when the battery charger is determined to be connected.

It will be seen below that configurations of the present invention are able to signal that a vehicle is connected to a battery charger and/or disable the vehicle while the vehicle is connected so that it is either less likely or impossible to drive the vehicle away while the charger is connected. Moreover, configurations of the present invention allow a determination of whether a vehicle is connected to be made without the addition of extra wires between the charger and the vehicle.

DETAILED DESCRIPTION OF THE INVENTION

Figure 1:
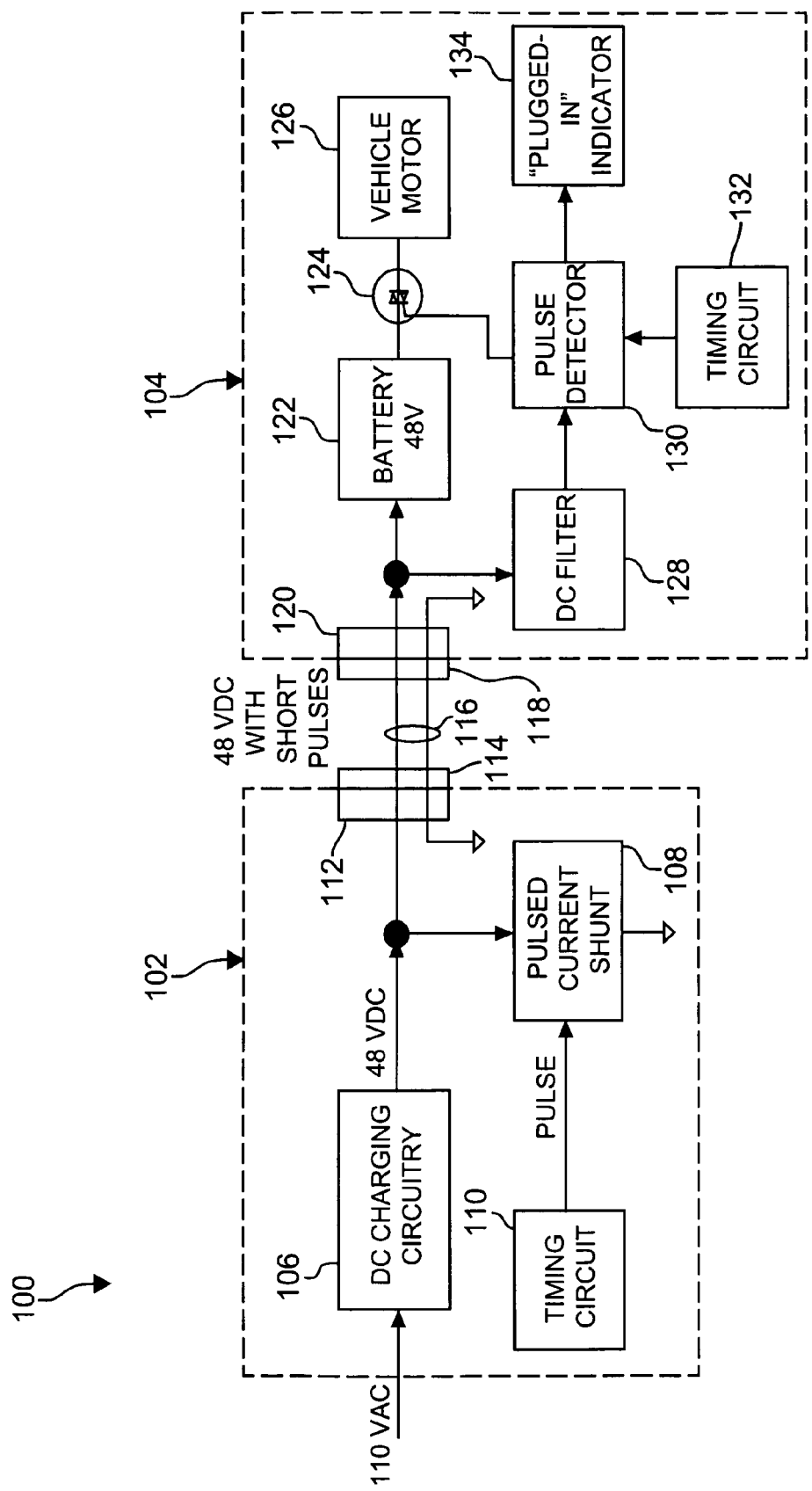
FIG. 1 is a block schematic diagram of a configuration of the present invention.

In some configurations of the present invention and referring to FIG. 1, a system 100 is provided that includes a battery charger 102 and an electric vehicle 104. Battery charger 102 includes a DC charging circuit 106 configured to convert a suitable source of power (e.g., 110 VAC) to a DC voltage (e.g., 48 VDC) suitable for charging battery 122 in electric vehicle 104. Battery charger 102 includes a socket 112 with two terminals for power and ground. A pulsed current shunt 108 having a high di/dt periodically draws a large pulse of current from the output of charging circuit 106, thereby periodically reducing its voltage for short periods of time at a known, preselected interval supplied by a timing circuit 110.

Electric vehicle 104 also has a socket 120 with two terminals. To charge battery 122 in electric vehicle 104, a two-conductor cable 116 is connected between socket 112 and socket 120 by plugging connectors 114 and 118 into their respective sockets. A number of alternate configurations are also possible, including configurations in which cable 116 does not plug into one or the other of sockets 112 and 120 and is hard-wired to one of either charger 102 or vehicle 104, respectively. Other configurations may provide terminals instead of sockets that are configured for clipping spring-loaded clips connected to the ends of wires or cables 116. Also, nothing about the invention prohibits more than two electrical wires connecting charger 102 and vehicle 104. Such additional wires could be used for any purpose, including the carrying of additional charging current, different voltages, or even an additional connection signal indicating that charger 102 is physically and electrically connected to vehicle 104 as a backup system to the present invention. However, it is an advantage of the various configurations of the present invention that only two wires are actually required to sense that a physical and electrical connection to charger 102 exists. Therefore, further discussion will be directed to the illustrated configuration 100.

In some configurations of the present invention, the same voltage used to charge battery 122 is also filtered by a DC filter 128 to remove the DC component of the charging voltage to facilitate pulse detection. The output of DC filter 128

(or the battery charging voltage, possibly shifted or scaled, in configurations of the present invention in which DC filter 128 is absent) is sent to a pulse detector 130, which determines whether periodic voltage fluctuations are present. A timing circuit 132 can be provided for use by pulse detector circuit 130 to ensure that these periodic voltage fluctuations occur at the known, preselected interval set by timing circuit 110 in battery charger 102. If pulse detector 130 determines that the periodic pulses are present, two actions are taken in configuration 100. One action is the activation of a "plugged-in" indicator 134, which could be a warning light or other signal on the dashboard of vehicle 102. The other action is the deactivation of vehicle motor 126. As shown in FIG. 1, a triac 124 or other type of switch or relay is opened by a signal from pulse detector 130 when the periodic pulses are present.

In some configurations of the present invention, it may be sufficient to provide only one or the other of the two actions described above. Also, the method used to deactivate vehicle motor 126 need not necessarily be that described above. For example, if vehicle 104 is key or switch operated, and the key or switch controls a low current that closes a relay allowing vehicle motor 126 to receive current, it would be sufficient for pulse detector 130 to open the circuit providing the low current to the key or button rather than the high current to vehicle motor 126.

Figure 2:
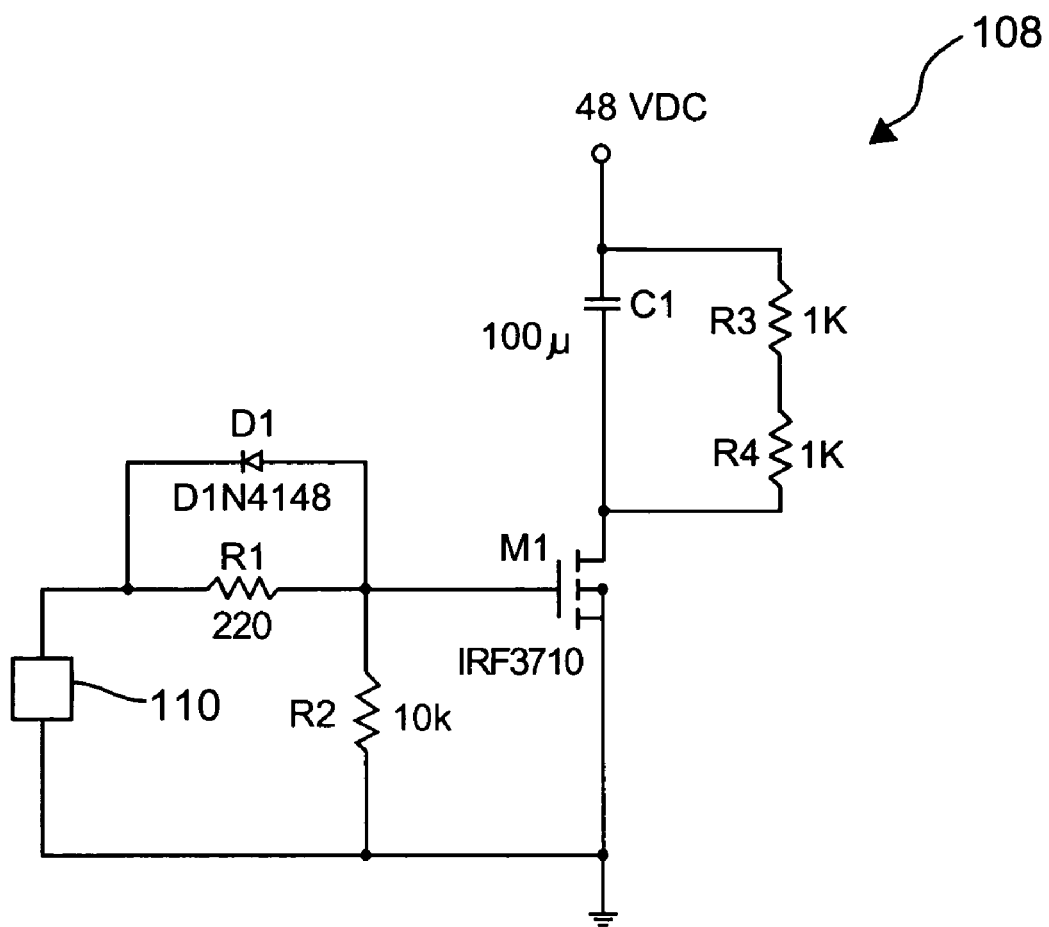
FIG. 2 is schematic diagram of an example of a suitable circuit configuration for the pulsed current shunt shown in FIG. 1.

An example of a suitable circuit for pulsed current shunt 108 in some 48 VDC charging systems is shown in FIG. 2. Timing circuit 110 can be any suitable circuit configured to control pulsed current shunt 108. By way of non-limiting example, timing circuit 110 can be a multivibrator, a crystal oscillator, or a signal pulse from a clocked microprocessor. In many configurations, a microprocessor is used to control battery charger 102, so using the same microprocessor as timing circuit 110 adds little to the cost of such configurations.

Figure 3:
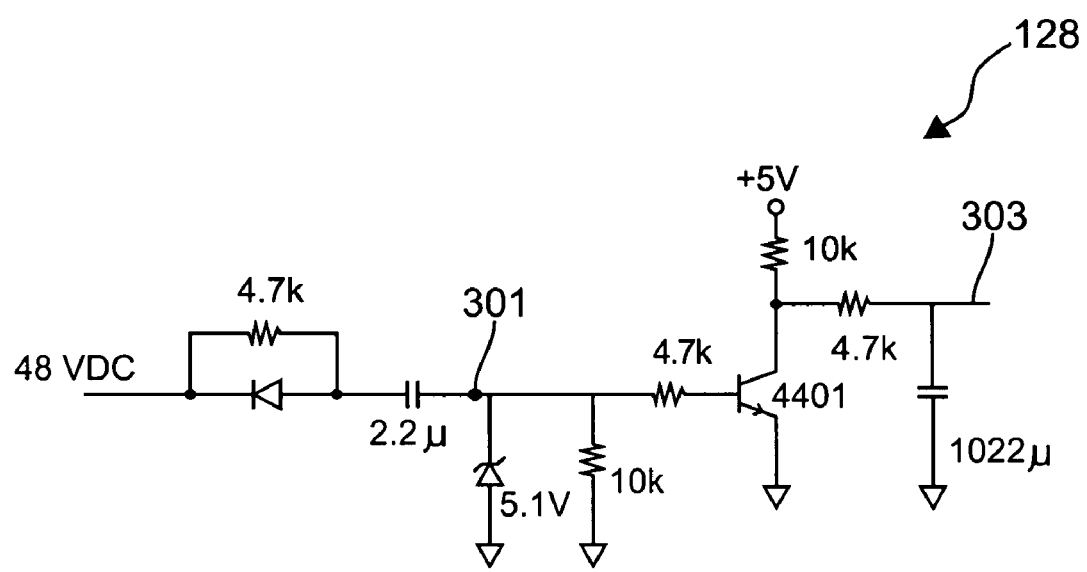
FIG. 3 is a schematic diagram of an example of a suitable circuit configuration for the DC filter shown in FIG. 1.

An example of a suitable circuit for DC filter 128 in some 48 VDC vehicle systems is shown in FIG. 3. In many vehicle 104 configurations, a microprocessor is provided for control of the vehicle and/or for other functions. Thus, pulse detector circuit 130 can be part of an existing clocked microprocessor without significant added expense, and timing circuit 132 can be the microprocessor clock or a signal generated internal to the microprocessor.

Figure 4:
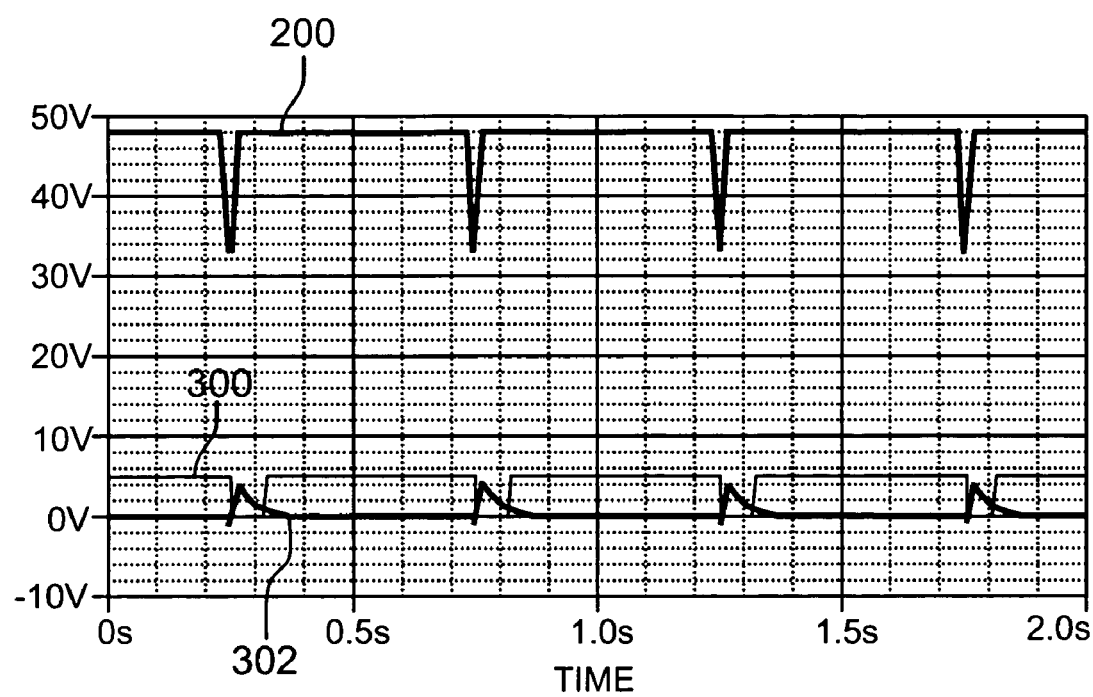
FIG. 4 is a graph of various voltages from the circuit configurations shown in FIGS. 1 and 3.

An example of voltages appearing in system configuration 100 is shown in the graph of FIG. 4. Signal 200 represents the 48 VDC produced by DC charging circuit 106 as periodically shunted by pulsed current shunt 108. Signal 300 represents the voltage at point 303 on FIG. 3, and signal 302 represents the voltage at point 301 on FIG. 3.

In illustrated configuration 100, a pulsed current shunt 108 is provided and configured to reduce the voltage appearing on the DC line at a periodic interval. However, it would be straightforward to modify configuration 100 so that the DC voltage is increased periodically rather than decreased, and so that pulse detector 130 detects this periodic increase in voltage rather a periodic decrease. Thus, pulsed current shunt 108 might more generally be labeled as a "signal superimposing circuit." Pulse detector 130 might correspondingly be labeled as a "superimposed signal detection circuit."

The duration of the voltage pulses, whether positive or negative, is not limited by the invention, but may be limited by practical considerations. For example, shunting pulses need not be longer than a few milliseconds, if that long. On the other hand, longer pulses may, in some configurations, draw excessive current from DC charging circuit 106, battery 122, or may adversely affect pulsed current shunt 108. The interval between pulses is not limited by the invention, but may also be limited by practical considerations. For example, the longer the period between pulses, the longer it will take pulse detector 130 to indicate that it has not received an expected pulse, and thus, the longer it will take for either a warning indication to be disabled or for the vehicle motor to be enabled after vehicle 104 is disconnected from charger 102. On the other hand, it is desirable to be applying the correct voltage to battery 122 most of the time, so extremely short periods between pulses may not be desirable. The combination of pulses lasting about 10 ms and occurring about every 0.5 s, as shown by signal 200 on FIG. 4, provides a system that responds promptly yet does not significantly affect either battery 122 or DC charging circuit 106. Also, with pulses occurring this rapidly, pulse detector 130 can be configured to detect the presence or absence of a plurality of pulses to increase noise immunity without introducing unreasonable delay in its responsiveness.

Although pulses are used in configuration 100 to determine the presence of a connection between charger 102 and vehicle 104, any signal that can be superimposed on the charging voltage at charger 102 and identified in the charging voltage at vehicle 104 can be used, as long as it does not significantly interfere with the charging of battery 122. Moreover, configurations of the present invention are not limited to use with vehicles 104, but can be used in conjunction with other devices having a battery that should not be inadvertently disconnected from a charging source.

It will thus be appreciated that configurations of the present invention are able to signal that a vehicle is connected to a battery charger and/or disable the vehicle while the vehicle is connected so that it is either less likely or impossible to drive the vehicle away while the charger is connected. Moreover, configurations of the present invention allow a determination of whether a vehicle is connected to be made without the addition of extra wires between the charger and the vehicle.

While the invention has been described in terms of various specific embodiments, those skilled in the art will recognize that the invention can be practiced with modification within the spirit and scope of the claims.

What is claimed is:

1. A method for determining whether a battery is electrically and physically connected to a battery charger, said method comprising:
   providing an electric device that includes a battery and a superimposed signal detector circuit;
   connecting a battery charger to the electric device across at least one connector;
   monitoring, using the superimposed signal detector circuit, a battery charging voltage supplied to the electric device across the at least one connector by the battery charger, wherein the battery charger has superimposed a known signal on the battery charging voltage using a shunt to reduce the battery charging voltage for a predetermined interval of time;
   determining that the battery charger is connected when the known superimposed signal is present and that the battery charger is not connected when the known superimposed signal is absent; and
   opening a switch upon detection of the known superimposed signal to enable executing an output.

2. A method in accordance with claim 1 wherein the electric device is a vehicle, said determination performed within the vehicle.

3. A method in accordance with claim 2 further comprising activating an indicator when it is determined that the battery charger is connected.

4. A method in accordance with claim 2 further comprising disabling a motor in the vehicle when the battery charger is connected.

5. A method in accordance with claim 2 wherein the at least one connector includes a cable having only two wires.

6. A method in accordance with claim 1 wherein the known superimposed signal comprises periodic pulses.

7. A method in accordance with claim 1 wherein said monitoring the battery charging voltage comprises filtering DC from the battery charging voltage.

8. A battery charger comprising:
a DC charging circuit configured to provide a DC charging voltage;
a signal superimposing circuit configured to superimpose a known signal on the DC charging voltage using a shunt to reduce the battery charging voltage for a predetermined interval of time;
at least one connector for connecting said battery charger to an electric device that includes a superimposed signal detector circuit, said battery charger configured to transmit the supcrimposed signal across said at least one connector to be detected by the superimposed signal detector circuit; and
a switch configured to open upon detection of the superimposed signal to enable execution of an output.

9. A battery charger in accordance with claim 8 wherein the signal superimposing circuit is a pulsed current shunt circuit.

10. A battery charger in accordance with claim 9 further comprising a timing circuit, and wherein the pulsed current shunt circuit generates pulses in accordance with the timing circuit.

11. A battery charger in accordance with claim 8 wherein said at least one connector comprises only two electrical wires.

12. A battery charger system comprising:
a battery charger comprising a DC charging circuit and a signal superimposing circuit;
a superimposed signal detector circuit positioned within an electric device including a chargeable battery; and
at least one connector connecting said battery charger to the electric device, said DC charging circuit configured to provide a battery charging voltage across said at least one connector to the electric device, said signal superimposing circuit configured to superimpose a known signal on the battery charging voltage using a shunt to reduce the battery charging voltage for a predetermined interval of time, said superimposed signal detector circuit configured to detect the known superimposed signal; and
a switch configured to open upon detection of the known superimposed signal, said switch further configured to signal that said battery charger is connected to the electric device and inhibit operation of the electric device when said battery charger is connected to the electric device.

13. A battery charging system in accordance with claim 12 wherein the electric device is a vehicle.

14. A battery charging system in accordance with claim 13 wherein said superimposed signal detector circuit is configured to activate an indicator when the presence of a battery charger connection is detected.

15. A battery charging system in accordance with claim 13 wherein the electric device includes a motor, wherein said superimposed signal detector circuit is configured to prevent the motor from operating when a presence of a battery charger connection is detected.

16. A battery charging system in accordance with claim 12 wherein the known superimposed signal comprises periodic pulses, said superimposed signal detector comprises a pulse detector.

17. A battery charging system in accordance with claim 16 further comprising a timing circuit configured to control the pulse detector to detect signals of known periodicity.

18. A battery charging system in accordance with claim 17 wherein said signal superimposing circuit comprises a pulsed current shunt.

* * * * *